United States Patent [19]

Gjerdrum et al.

[11] Patent Number: 4,891,514

[45] Date of Patent: Jan. 2, 1990

[54] DEVICE FOR MONITORING RADON EXPOSURE

[75] Inventors: David Gjerdrum, 559 Barron Ave., Palo Alto, Calif. 94306; Joseph Decuir, Albany, Calif.

[73] Assignee: David M. Gjerdrum, Palo Alto, Calif.

[21] Appl. No.: 117,059

[22] Filed: Nov. 5, 1987

[51] Int. Cl.$^4$ .............................................. G01T 1/24
[52] U.S. Cl. ..................................... 250/255; 250/253; 250/370.02
[58] Field of Search ..................... 250/255, 253, 370.02

[56] References Cited

U.S. PATENT DOCUMENTS

| 3,502,876 | 3/1970 | Lasseur | 250/370.02 |
| 4,055,762 | 10/1977 | Durkin | 250/370.02 |
| 4,499,377 | 2/1985 | Presser | 250/343 |
| 4,700,067 | 10/1987 | Carossi et al. | 250/370.02 |

FOREIGN PATENT DOCUMENTS 0218090  10/1985  Japan .............................. 250/370.02

OTHER PUBLICATIONS

Bigu et al., "Pass. Radon ... Dosimeter ... ", Rev. Sci. Instrum. 56(1) (Jan.—1985) p. 146.
May et al., "A New Phys. Mech. for Self Errors ... ", Proc. 16th Intern. Reliability Physics Symp. (Apr. 1978) pp. 33–40 (α–Soft Digest).

Primary Examiner—Janice A. Howell
Assistant Examiner—Richard Hanig
Attorney, Agent, or Firm—Rosenblum, Parish & Bacigalupi

[57] ABSTRACT

A device for monitoring radon exposure including a cube-shaped, light-tight detection chamber having approximately one-inch square sides, five sides of which each contain an integrated circuit alpha particle detector, with a sixth side having fluid intake and exhaust ports and temperature and humidity sensors. Each integrated circuit device is responsive to detect alpha particles emitted by any decaying radon-222 atoms or daughter isotopes within the detection chamber. The detected results of each integrated circuit device is communicated to an external logic system which calculates the relative level of radon concentration within the chamber and stores the information in memory, or reports the information to a variety of peripheral devices.

18 Claims, 9 Drawing Sheets

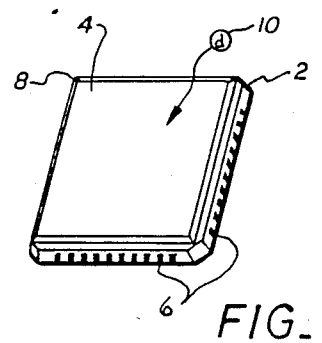
FIG_ 1
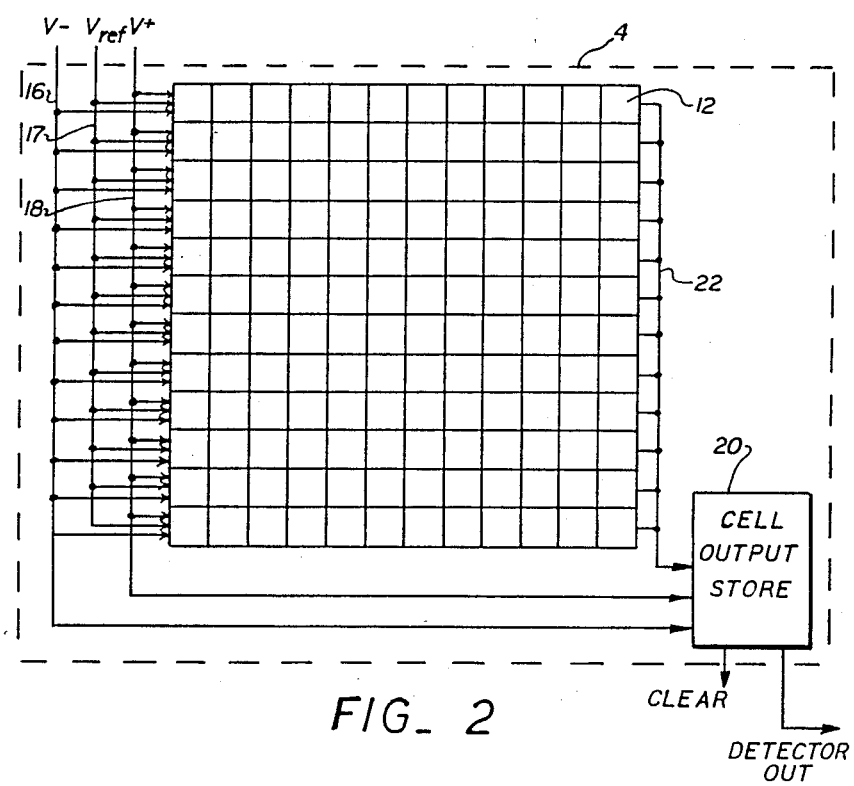
FIG_ 2

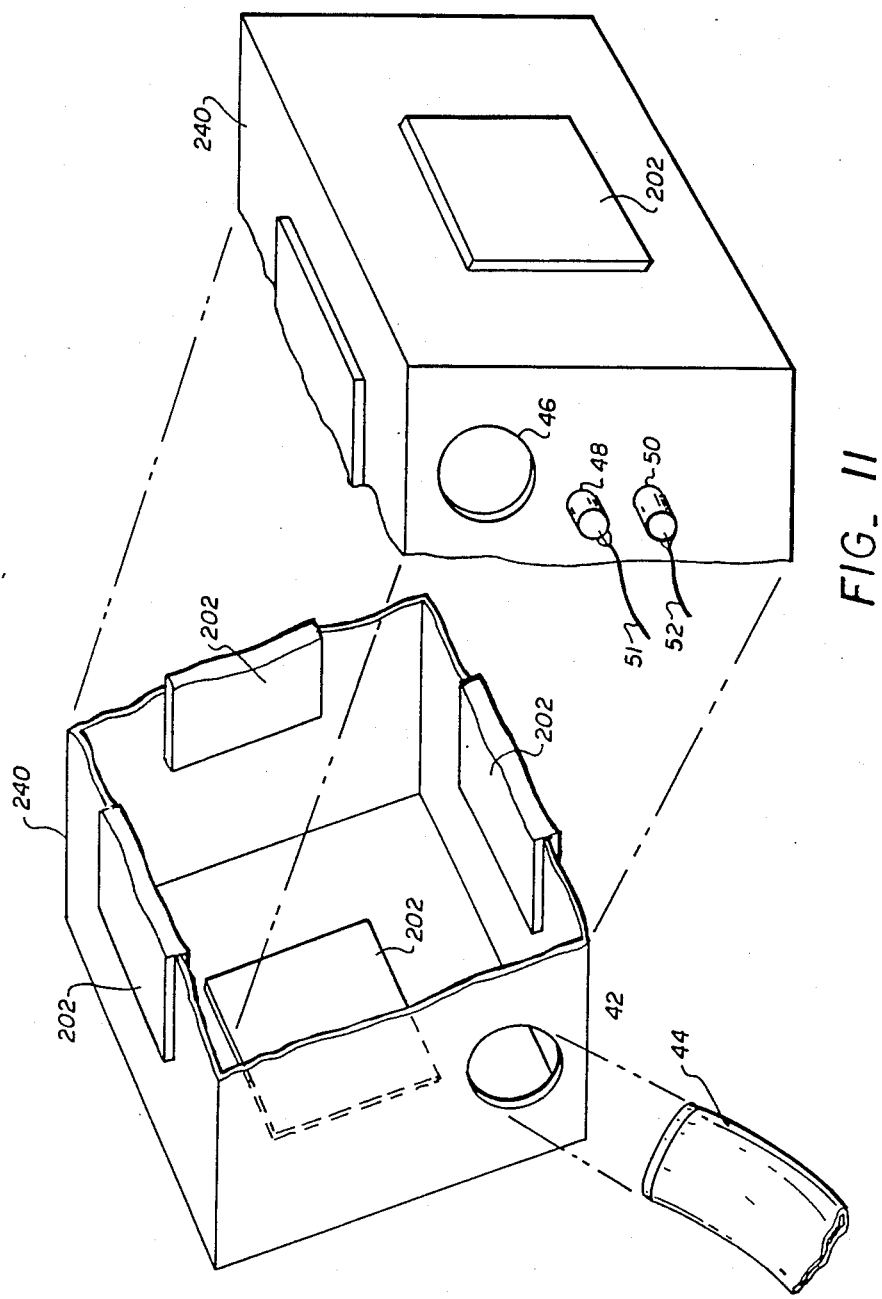

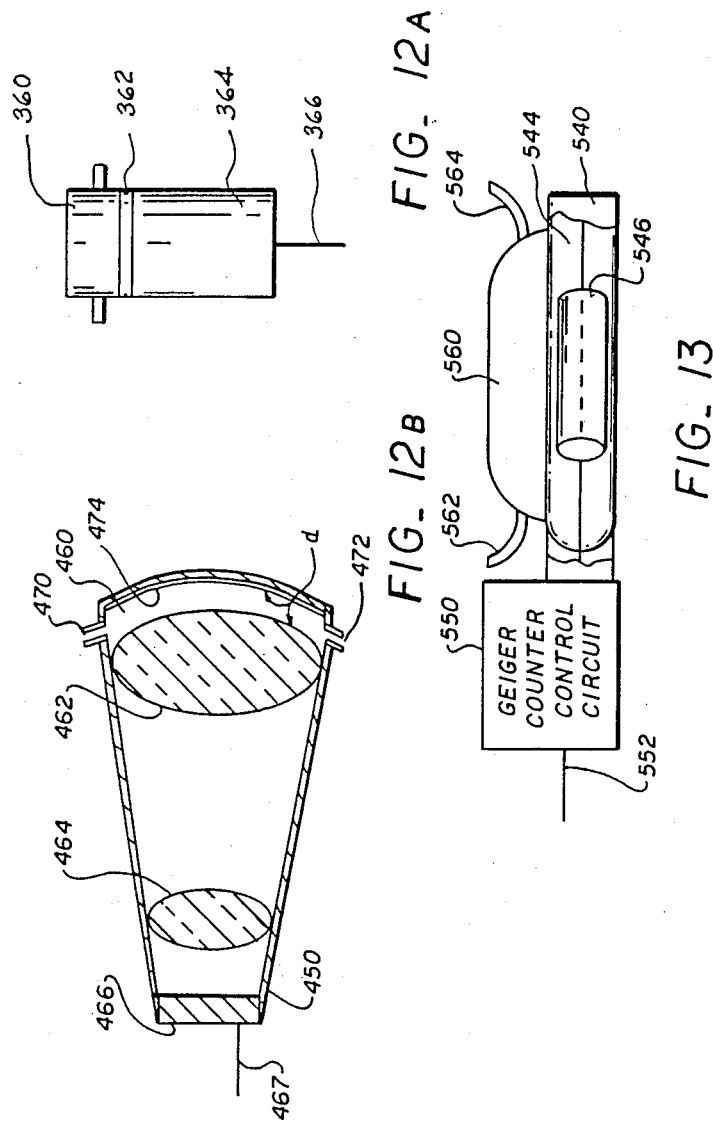

DEVICE FOR MONITORING RADON EXPOSURE

BACKGROUND OF THE INVENTION

1. Field of the Invention

The present invention relates generally to radiation detection systems, and more particularly, to a system for monitoring radon-222 exposure within a number of different sample environments under a variety of conditions.

2. Discussion of the Prior Art

The uranium mining industry has long known that radon-222 gas will collect in various concentration levels at or near the surface of the earth above naturally occurring uranium 238 deposits. Accordingly, a large number of radiation detectors have been developed over the last decade to measure the concentration of radon-222 gas in the atmosphere above the earth or in the ground just below the earth's surface.

Radon-222 is a radioactive gas with a half-life of 3.825 days and is generated during the radioactive transformation of uranium 238. During the initial decay of radon-222 to polonium-218, radon atoms will emit alpha particles having approximate voltages of 5.0 MeV (megaelectron volts). The quantity of these alpha particles is directly proportional to the level of radon concentration within the immediate environment. Thus, measuring the quantity of alpha particles within a certain area has long been an accepted method of determining the level of radon concentration, (see U.S. Pat. No. 3,665,194).

One prior art method of detecting alpha particles emitted by decaying radon-222 within a certain environment consists of positioning an alpha particle detector within a housing and selectively passing air or gas across the surface of the detector, thereby allowing the detector to interact with the alpha particles (U.S. Pat. Nos. 4,342,913 and 4,607,165). Other prior art devices use filters to capture radon-222 atoms and/or daughter isotopes from the surrounding environment so that the alpha particle emitting matter can be disposed in close proximity to the radiation detector. Related prior art devices are disclosed by U.S. Pat. Nos. 3,968,371 and 3,558,884, as well as U.S. Pat. No. 4,518,860. (See also U.S. Pat. Nos. 4,417,142; 4,426,575; and 4,468,558, all issued to Kristiansson et al, for similarly related devices).

The type of radiation detection devices which have been used in prior art devices has varied greatly. A number of these devices, such as those using a chamber inserted in the ground, have used a scintillation counter (U.S. Pat. No. 4,352,014), a nuclear track detector foil (U.S. Pat. No. 4,385,236), a phosphor screen in combination with a photo multiplier (U.S. Pat. No. 3,056,886), or a semiconductor detector (U.S. Pat. No. 4,104,523, issued August 1, 1978, to Wolfert). When charged particles move through a semiconductor of a semiconductor device they lose kinetic energy, primarily through ionization processes, just as they do when they move through the gas of a gas detector. By developing electric fields across a depletion region of an n-type/p-type semiconductor, a sensitive region can be developed. When an ionization particle traverses the sensitive region it produces electron-hole pairs that are swept away by the electric field and thereby produce an electric-current pulse which can be detected and measured. Although such devices are known, their detection accuracy has not been high and the cost of adequately sized and accurate detectors has been prohibitive.

Although prior art radon-222 detectors have proven capable of detecting levels of radon concentration above or in the ground, such devices are restricted as to the type of different environments or different conditions in which they can be used. In addition, such devices have had little utility outside of the scientific environment because the devices reported levels of radon concentration in terms which carried little or no meaning for most persons. A need has arisen for a radon-222 detector which is capable of operating in a number of different environments under a variety of different conditions and reporting the levels of radon concentration in easily understandable terms.

Events occurring in the past decade have lead to greater concerns regarding the potential environmental human health hazards presented by human produced and naturally occurring radioactive sources in the vicinity of the home and work place. The high-energy levels of alpha particles, which are much higher than the other by-products of atomic break-down, such as beta particles (electrons) and gamma radiation (photons), can cause chemical reactions to occur in virtually any object, when that object is struck by an alpha particle. In some objects the displacement of electrons may not prove to be consequential since atoms are simply displaced with no resulting change in atomic structure. In the human body, however, the displacement of a single electron or atom can cause a local chemical reaction which may eventually result in cancer formations. In view of the above, the Environmental Protection Agency has recently issued a warning concerning the cancerous effect of certain levels of radon-222 concentration in the home and work place.

SUMMARY OF THE PRESENT INVENTION

It is therefore an object of the present invention to provide a system for accurately monitoring the presence of radon-222 in the home and work place and for reporting the levels of radon concentration in easily understandable terms.

Another object of the present invention is to provide a system for monitoring the presence of radon-222 that is adaptable to use within a gaseous or liquid environment.

Still another object of the present invention is to provide a system for monitoring the presence of radon-222 that is adaptable to use with a variety of different types of alpha particle detection devices.

A further object of the present invention is to provide a system for monitoring the presence of radon-222 which is capable of restricting the flow of the fluid of the sampled environment so as to maintain the greatest likelihood of alpha particle detection.

A still further object of the present invention is to provide a system for monitoring the presence of radon-222 in which an integrated circuit device may be used for the accurate and controllable detection of alpha particles.

A still further object of the present invention is to provide a system for monitoring the presence of radon-222 which can be affixed within a building or used as a mobile, personal dosimeter.

Another further object of the present invention is to provide a system for monitoring the presence of radon-222 capable of providing updated results indicating changing levels of radon-222 concentration, in dosimetric terms, for observation, storage, or use by other systems.

Briefly, a preferred embodiment of the monitoring system includes a cube-shaped, light-tight detection chamber having approximately one-inch square sides, five sides of which each contain an integrated circuit alpha particle detector, with a sixth side having fluid intake and exhaust ports and temperature and humidity sensors. Each integrated circuit device is responsive to detect alpha particles emitted by any decaying radon-222 atoms or daughter isotopes within the detection chamber. The detected results of each integrated circuit device is communicated to an external logic system which calculates the relative level of radon concentration within the chamber and stores the information in memory, or reports the information to a variety of peripheral devices.

These and other objects of the present invention will no doubt become apparent to those skilled in the art, after having read the following detailed disclosure of a preferred embodiment which is illustrated in the several figures of the drawing.

IN THE DRAWING

FIG. 1 is a perspective view of an integrated circuit device which may be used in accordance with a preferred embodiment of the present invention;

FIG. 2 is a diagram schematically illustrating the memory cells and the cell output store of the internal electronic structure of the integrated circuit device of FIG. 1;

DETAILED DESCRIPTION OF A PREFERRED EMBODIMENT

Figure 3:
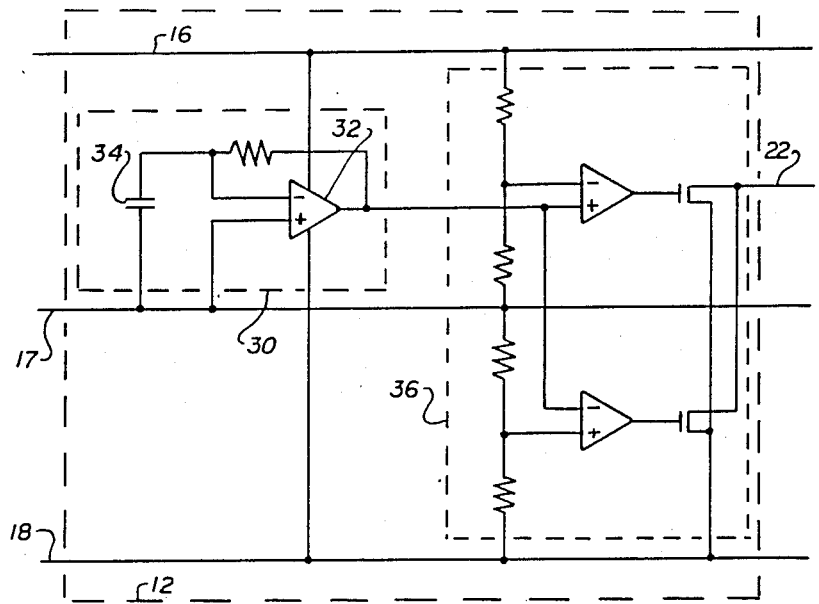
FIG. 3 is a diagram further schematically illustrating one memory cell of the plurality of cells shown in the integrated circuit of FIG. 2.

Radioactive particles of sufficient energy can cause considerable disruption to any material which they encounter. As previously stated, if alpha particles strike living matter, they can break apart chemical bonds in the intricate macro molecules resulting in local injury or even genetic damage. Similarly, in complex artificial crystal structures, such as common commercial integrated circuits, alpha radiation can knock electrons or entire atoms out of place, resulting in either temporary erroneous operation or permanent damage.

The known vulnerability of integrated circuits to radiation has been a major problem in the art of digital memory devices, especially with regard to dynamic random access memory (DRAM). If some of the steps taken to avoid radiation problems with conventional integrated circuit devices are reversed, the radiation detection ability of the integrated circuit device can be greatly enhanced. The later type of integrated circuit device would be ideal for use in accordance with a preferred embodiment of the present invention, as is illustrated in FIG. 1, in place of less accurate and more expensive prior art semiconductor detectors.

In FIG. 1, the integrated circuit 2 is shown in a conventional chip carrier package, having an interactive detection area 4, which contains a vast amount of electronic components internally connected to the signal pins 6. The signal pins 6 can have either extended pins (PLCC) or embedded pins (LCCC) which provide means for communicating information to and from the integrated circuit 2, to matching interface pins 7 in socket 8. The integrated circuit 2 can be inserted or removed from the socket 8 as desired without need for soldering the signal pins 6 to the interface pins 7. A registration notch 9 is also provided in the chip carrier package for correct orientating of the chip during use.

Although the preferred embodiment of the present invention utilizes a dynamic memory integrated circuit, a DRAM, any type of memory with discrete storage cells may be utilized. To fully understand how the integrated circuits of the present invention differ from prior art circuits, it is first necessary to understand the internal characteristics of integrated circuits. Dynamic memories are generally comprised of a large quantity of small capacitors (memory cells), each of which is capable of retaining a specific charge representing particular information. A change in the charge or voltage, retained by one of these tiny capacitors can be representative of a state change in the memory, such as a change from a 0 to a 1, or a 1 to a 0.

While a state change can be electrically caused to occur at any time, state changes can also occur because of the capacitor's natural tendency to leak voltage, or for other reasons. To prevent the loss of or change of information, each capacitor is periodically read to ascertain its current voltage level, and then rewritten with the same charge to assure the maintenance of the particular information retained by the capacitor; a process referred to as refreshing the memory. Rewriting will normally be effective to correct both soft errors and firm errors, which may occur in different integrated circuit devices. A firm error is defined as a change in data occurring as the result of a transfer of charge, from the floating gate of a floating gate memory, by ionizing radiation. Another type of error, a hard error, cannot be corrected. Hard errors are a result of permanent damage to the charge detection characteristics of the device. Hence, a device must not only be able to recognize soft errors or firm errors, but also hard errors, and be able to remove the affects of the latter from the system.

The lower the level of charge or voltage retained by a capacitor, the greater the likelihood of that capacitor being affected by radiation. If a capacitor already has a very small charge, the leakage of any of that charge will make the capacitor even more vulnerable to radiation. Thus, a high energy particle, such as an alpha particle, interacting with one or more of these capacitors, or memory cells, may be sufficient to knock the charge across a capacitor and cause a change in the data. The subsequent refresh cycle would simply read the new data and rewrite that same information rather than the previous information, thereby merely amplifying and preserving the error.

Prior art methods of compensating for the vulnerability of DRAM circuits to radiation have included some of the following steps:

(1) improving the circuit manufacturing process to reduce the leakage rate of the capacitors;

(2) increasing the capacitor voltage to lessen the likelihood of radiation particles displacing charges stored in the capacitors;

(3) refreshing the capacitors with greater regularity in order to retain a higher average charge within the capacitor; and (4) reducing the level of radioactive material in the DIP or chip carrier package in order to decrease the exposure of the capacitors to radiation sources. By reversing all but the last of the above compensation methods, a DRAM circuit can be converted into a highly efficient radiation detector.

Removing the plastic or ceramic protective coating over the detection area 4, with which DRAM's are normally outfitted, will allow radioactive particles to come into direct contact with the surface of the detection area 4. The DRAM can still be protected from the environment by covering the exposed surface with a mylar coating, or something similar, that will permit the passage of alpha particles. Operating the memory cells at lower overall voltages and reducing the refresh rate will also increase the effect of any radiation coming into contact with the detection area. It should be noted however, that although the voltage level and refresh rate can be lowered, both must still be sufficient enough to compensate for the thermal noise level present in the memory cells. If the preceding steps are taken, there will be a greatly enhanced likelihood that an alpha particle 10 striking the detection area 4 will be detected.

In addition to the previously mentioned enhancement techniques, other steps can be taken to produce an even better radiation detector. These additional steps may be better understood by reference to FIG. 2, which schematically illustrates the internal structure of the detection area 4. As stated, the detection area 4 is comprised of a large quantity of tiny capacitors, or memory cells 12, which are generally aligned in an orthogonal array of rows and columns, but which may also be aligned in any other suitable manner, such as in concentric circles. When DRAM arrays are used for their conventional function, such as data storage, a large portion of the area 4 is devoted to "word" and "bit" access lines, rather than for bit storage capacitors. The ratio between storage capacitors and access lines in conventional DRAM arrays may be as high as 1:1. By configuring the area 4 to have a greater quantity of memory cells, or larger memory cells, and thereby increasing the ratio of memory cell space to access lines, the likelihood of detecting radiation can be increased by a proportional amount.

It should also be noted that if the direction in which a charge is moved in response to the detected alpha particle is in the same direction as the existing data charge in the capacitor, no state change will occur and no radiation will be detected. In other words, if the state of a particular memory cell corresponds to a 1, which may for example be represented by some positive voltage level within the capacitor, and the alpha particle induces a greater voltage level to be retained by the capacitor, the state of the memory cell would still be 1, rather than moving from 1 to 0. Since there is no recognizable higher state of 1 in binary logic, there can be no net data charge change in such a situation and therefore no radiation detection.

If the distribution of the data in the memory cells 12 of the detection area 4 is random, or the direction of induced charge in the capacitor of the memory cell 12 has an equal opportunity for being in either direction, then no more than one half of all radiation exposed to the detection area 4 will be detected. To increase the radiation detection ability of the detection area 4, each capacitor or cell must be designed to detect charge differences in either direction, an effect which will essentially double the probability of radiation detection. Such a design may be accomplished by designating each detector to have a quiescent charge difference of zero (meaning the memory cell is inactive, or held at neither the phase state of 1 nor 0, whereby all charge changes of sufficient size may be detected. The only limitations to such a design would be a result of the residual thermal noise level within the detector and the sensitivity of the detector circuit itself.

The quiescent charge is developed and maintained within the cells 12 through means of the three voltage inputs 16, 17 and 18, and are reported to a cell output store 20 through communication line 22. It should be noted, however, that the cell output store 20 provided for in the preferred embodiment is not absolutely necessary in all situations, provided some means is available for sending out the state changes of the cells 12. In fact, the cell output store 20 may actually be undesirable, because it requires space that would be otherwise available for detection cells. In addition, because each cell in the cell array is read and refreshed periodically, to a quiescent charge difference of zero, it may also be necessary to clear the cell output store 20 of any stored memory during each refresh cycle. If such is the case, the read and subsequent output of information simply eliminates the actual need for a cell output store.

A detailed schematic illustration of a memory cell 12 from detection area 4 is provided in FIG. 3. Each cell is comprised of an integrated capacitor 30 for radiation detection, having a sense amplifier 32 wired to clamp a capacitor 34 to a certain voltage level. Any charged induced across the capacitor 30 would be detected and balanced by the sense amplifier 32. The output of the sense amplifier 32 is input to a well known dual comparator circuit 36, which detects the level of activity in the sense amplifier 32 and reports the detected result to the cell output store 20 for transmission to external circuitry over the signal pins 6 and interface pins 7. Because soft errors represent detected radiation in the memory cells 12, there is no need for soft error recovery circuitry, thereby removing a large quantity of the circuitry normally included within the detection area 4.

The usage of larger cells in the detection area 4 and the elimination of much of what is currently utilized in such devices, means inherently simpler cells and larger scale mask works. As a consequence, the physical size of the detection area 4 in the preferred embodiment (1.2 CM/side) may be much greater than the size of the storage area in the conventional DRAM circuit (generally only 0.3 CM/side). A considerable portion of the cost associated with producing modern DRAM circuitry is a direct result of the reduced size of the circuit, hence, larger and simpler circuits may actually be less expensive to produce than smaller more complex circuits, provided sufficient quantities are produced to pay for their development.

Once a more effective radiation detector has been developed, it is necessary to design a detection chamber which fully utilizes the new detector. In designing an appropriate detection chamber, a number of factors are of primary consideration. First, radiation detection results must be reportable in dosimetric terms, such as directly or derivatively from a base measure of curies/liter, based on the fluid of the test environment, which may be either air, water, or some other substance.

In order to produce results of alpha particle detection in dosimetric terms, it is necessary to be able to calculate the volume of the environment tested over a certain period of time. Given a normal concentration of radon-222 in air, an alpha particle is emitted directly, or indirectly as a daughter isotope, from the radon-222 decay at least once every 300 minutes/milli-liter of sample environment. Thus, if the volume capacity of the detection chamber and environment flow rate are known, and a time base is available, such as a CPU clock, the detected results may be easily reported in dosimetric terms.

Some of the additional factors which also need to be considered when attempting to accurately determine the concentration of radon-222 are as follows: (1) increased radon-222 levels accuring during the nocturnal lowering of the troposphere; (2) increased radon-222 levels caused by inversion layers; (3) increased radon-222 particles caused by the trapping of radon-222 levels within buildings; and (4) the creation of higher concentration levels of radon-222 in some areas of the building because of air flow patterns within the building. Hence, in addition to simply calculating the level of radon-222, the detection device must be able to systematically adjust any reported results in accordance with the natural environmental changes that occur within the same test period.

An additional consideration in the design of the detection chamber concerns the visibility range of alpha particles emitted during the decay of radon-222 and its daughter isotopes. Visibility range means the distance which an alpha particle will travel before transforming into a different state or energy level. In air, alpha particles have a visibility range of approximately one inch, while in water the visibility range for an alpha particle is only approximately 1000th of the visibility range in air, or around thirty micro-meters. The difference in visibility range is primarily due to the difference between the density of the two environments. Thus, a properly designed detection chamber will take into consideration the small visibility range of the alpha particles to be detected. An elongated tube, with a detector at the bottom, placed on or embedded in the ground, can not properly direct the flow of fluid past the detection area and therefore cannot achieve optimum results.

Figure 4:
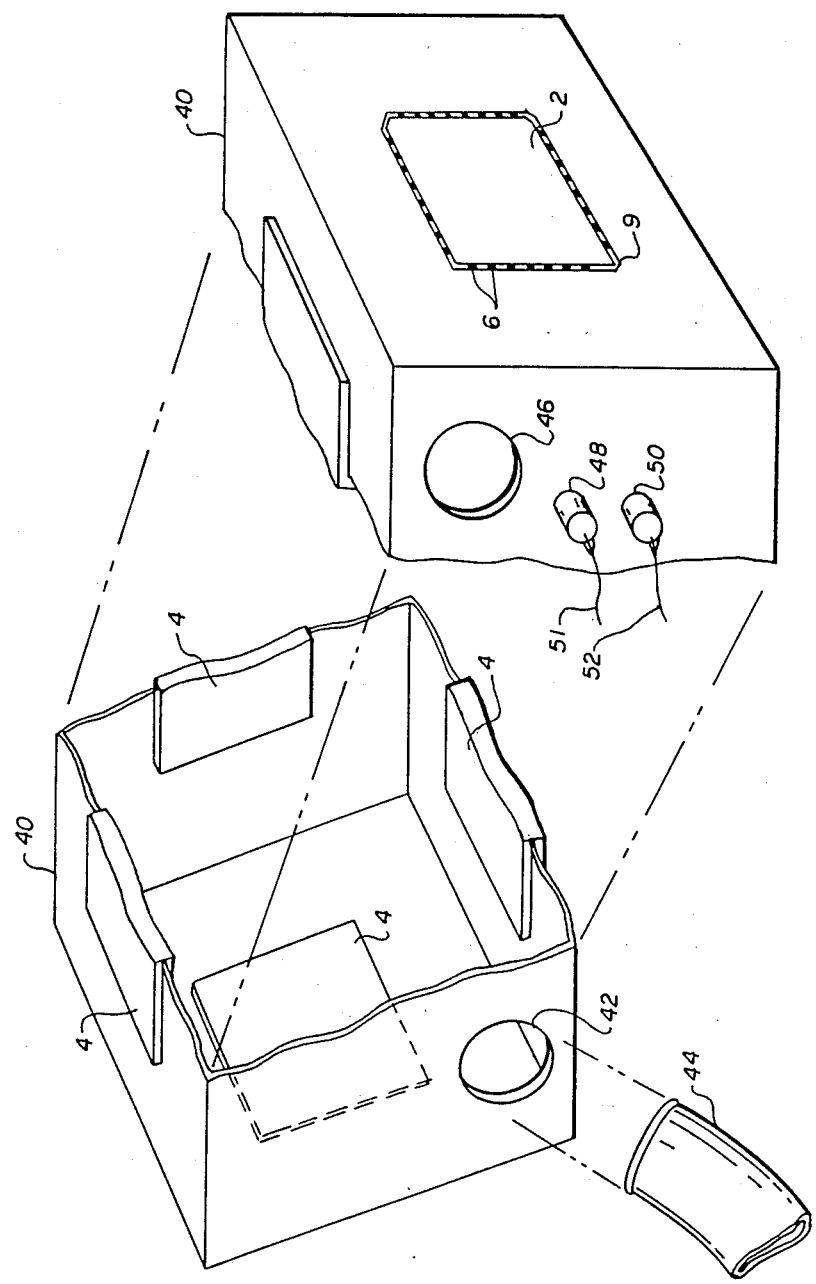
FIG. 4 is an exploded, partially broken, partially cutaway, perspective view of a cube-shaped detection chamber in accordance with a preferred embodiment of the present invention.

FIG. 4 illustrates an exploded, partially broken, partially cut-away, perspective view of a cube-shaped detector chamber 40 in which an integrated circuit 2 is centered in the sockets 8 in five of the six faces of the chamber 40. It should be noted, that only one DRAM, or detector 2, is shown in its complete chip carrier package form, while the remainder of the detectors are simply shown as being comprised of the detection area 4, in order to illustrate that a DRAM type detector 2 or any other type of surface radiation detector may be used in place of the DRAM detector 2. The sixth face of the chamber 40 is provided with an intake port 42, which is connected to a supply tube 44, and an exhaust port 46, which may be connected to an exhaust tube similar to the supply tube 44, for transporting fluid to and from the sample environment. In addition, the sixth side of the chamber 40 is provided with temperature sensor 48 and humidity sensor 50, which communicate temperature and humidity changes to an external monitoring system over lines 51 and 52, respectively. A humidity sensor is not required for monitoring a liquid environment. Although the chamber 40 can have sides of any length or width desired (or shape), the highest probability of detection will only be maintained if certain rigid geometric principles are followed, which will be further described below.

Figure 5:
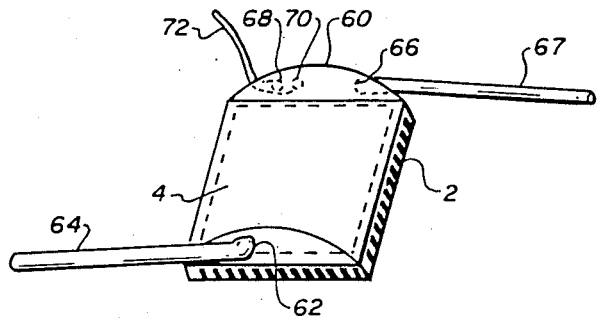
FIG. 5 is a perspective view of the integrated circuit device of FIG. 1, having an attached chamber over the detection element, in accordance with an alternative embodiment of the present invention.

An alternative embodiment of the detector chamber depicted in FIG. 4 is shown in FIG. 5, in which a domed, or hemispherically shaped chamber 60 is placed directly over the detection area 4 of the DRAM 2, as indicated by the dashed lines 4. Chamber 60 is affixed to the integrated circuit 2 to form a light-tight chamber. Many integrated circuit packages are equipped with connectors for heat sinks to which the chamber 60 can be readily connected, or the chamber 60 may be affixed in some suitable manner. As in the chamber 40, the domed chamber 60 has an intake port 62 connected to a supply line 64, and an exhaust port 66 connected to an exhaust line 67. Likewise temperature sensor 68 and humidity sensor 70 are also provided for within the chamber 60 for communication to an external monitoring system over the communication line 72.

Figure 6A:
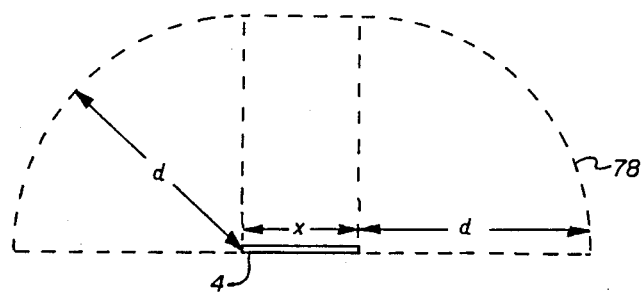
FIGS. 6A and 6B illustrate some of the physical constraints on the shape of the detection chamber in accordance with both a preferred and alternative embodiment of the present invention.

Given that the alpha particles have a particular visibility range and each detector surface has a distinct shape, the highest detection level can be achieved only when the detection chamber is conformed to take advantage of these characteristics. Determination of the correct shape of either the domed chamber 60 or the cube-shaped chamber 40 may be calculated by reference to FIGS. 6a and 6b, which illustrate some of the physical limitations on the detection chambers. FIG. 6A illustrates a cross-section of detection area 4, which has a length, and a visibility range d of alpha particles. If a radon-222 atom emits an alpha particle within the range d and in the direction of detection area 4, then the detection area 4 will be within the visibility range of the alpha particle, and therefore capable of detecting the alpha particle's presence. Hence, the operable range of the detection area 4 can be represented by the elliptically-shaped dashed-line 78, which is a distance d from at least one point on the surface of the detection area 4 at all times.

Figure 6B:
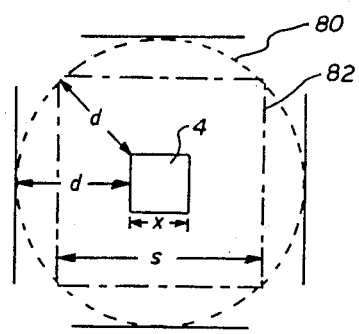
Figure 7:
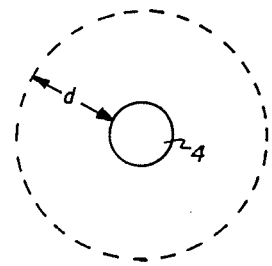
FIG. 7 illustrates some of the physical constraints on the shape of a detection chamber in accordance with a second alternative embodiment of the present invention.

A top view of the detection area 4, as shown in FIG. 6A, can be depicted as shown in FIG. 6B, where the detection area 4 has sides x, and is bounded by an outline of the cube-shaped chamber shown by the elliptically-shaped, dashed-line 80. The circumference of the ellipse 80 is a distance d from at least one point on the surface of the detection area 4 at all times. To understand the enhanced detection characteristics of the cube-shaped chamber shown in FIG. 4, four of the sides of the cube, each having a side length S and characterized by the long and short dashed line 82, are depicted in FIG. 6B. As can be seen from FIG. 6B, points within the chamber (shown by line 82) are within the range of the detection area 4, and further, the combination of the five detectors create overlapping ranges which enhances the radon-222 detection capabilities of the detection chamber 40. As previously stated, the detection area 4, may be an orthogonal array of rows and columns, or any other shape as may be appropriate. Hence, FIG. 7 illustrates a second alternative embodiment of the detection chamber in which the detection area 4 is circular and the circumference of the range d from points on the surface of the detection area 4 would form a spherically shaped chamber centered about the detection area 4.

Due to the difference in visibility ranges for alpha particles in air versus water, an acceptable detection chamber for use in a water environment would be required to be much smaller than a similar detection chamber used in an air environment. However, the same geometric constraints applicable to the air environment chamber must be followed; only on a much smaller scale. Likewise, it is to be understood that the integrated circuit, or detector, as designed for this particular detection chamber would also be sensitive to other forms of radiation, such as beta and gamma (photons) radiation. To avoid problems caused by other forms of radiation, the chamber must be a light-tight chamber and impervious to other forms of radiation. If the chamber is constructed out of a non-radiation emitting and radiation blocking substance, such as aluminum or an aluminum alloy, the detection chamber can be used to effectively restrict alpha particles from being admitted, while not emitting alpha particles itself.

As was previously mentioned, the detection area 4, as well as other elements of the detection chamber and detectors, must be protected from the corrosive effect of the environment in which they are utilized. Thus, alpha particle passive filters, such as mylar films or covers, which were previously described, should be used to protect the detection area from the test environment. It should also be noted, that use of a common chamber, that is, a detection chamber which also has temperature and/or humidity sensors, provides data of greater relevance than do systems utilizing sensors located outside of the test chamber.

Figure 8:
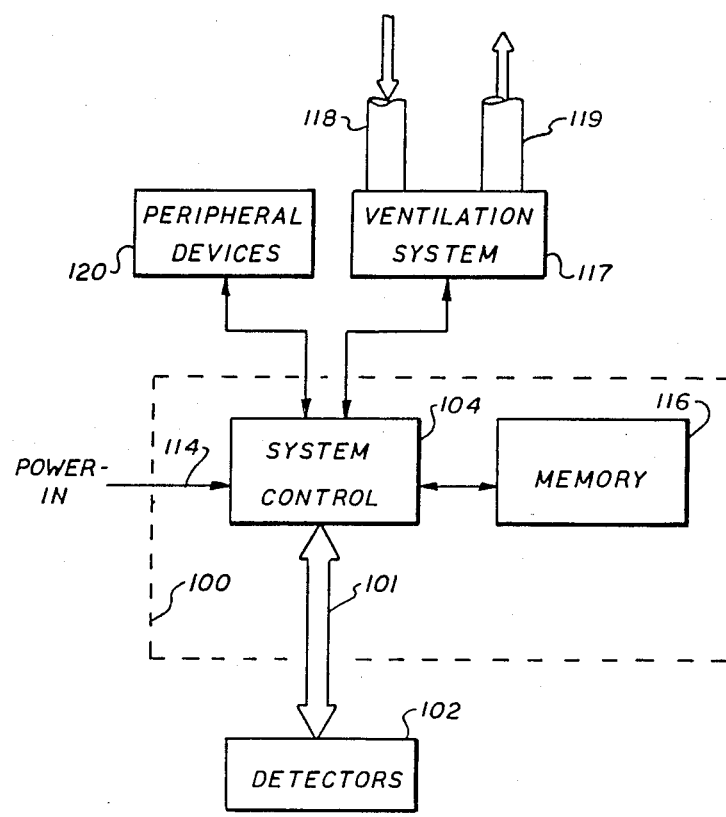
FIG. 8 is a block diagram illustrating a monitoring system in accordance with a preferred embodiment of the present invention.

FIG. 8 depicts a block diagram illustrating an external monitoring system 100 in accordance with the preferred embodiment of the present invention. Monitoring system 100 communicates over bus 101 with detectors 102, which include radon detectors 2, and may also include temperature and humidity sensors or any other type of sensing device. The monitoring system 100 includes a system control 104 that is supplied with power through the "POWER IN" line 114 and, in turn, supplies power and timing signals throughout the monitoring system 100 and to detectors 102. The system control 104 also directs the sampling of detectors 102, controls the operation of memory 116, and the interaction with ventilation system 117 or any peripheral devices 120 connected thereto. Ventilation system 117 receives fluid from the environment through input 118, cools, heats, or filters the fluid and either recirculates it within the environment or exchanges it with some other source through exhaust 119.

Data collected by the detectors 102 is periodically sampled from the detectors 102 by system control 104. The data is subsequently channeled to the system memory 116 after the data has been processed for storage. Additional configuration data, such as the time or constants to be used in determining the level of radon concentration, can be entered from the peripheral devices 120 or ventilation system 117 for storage by system memory 116.

Figure 9:
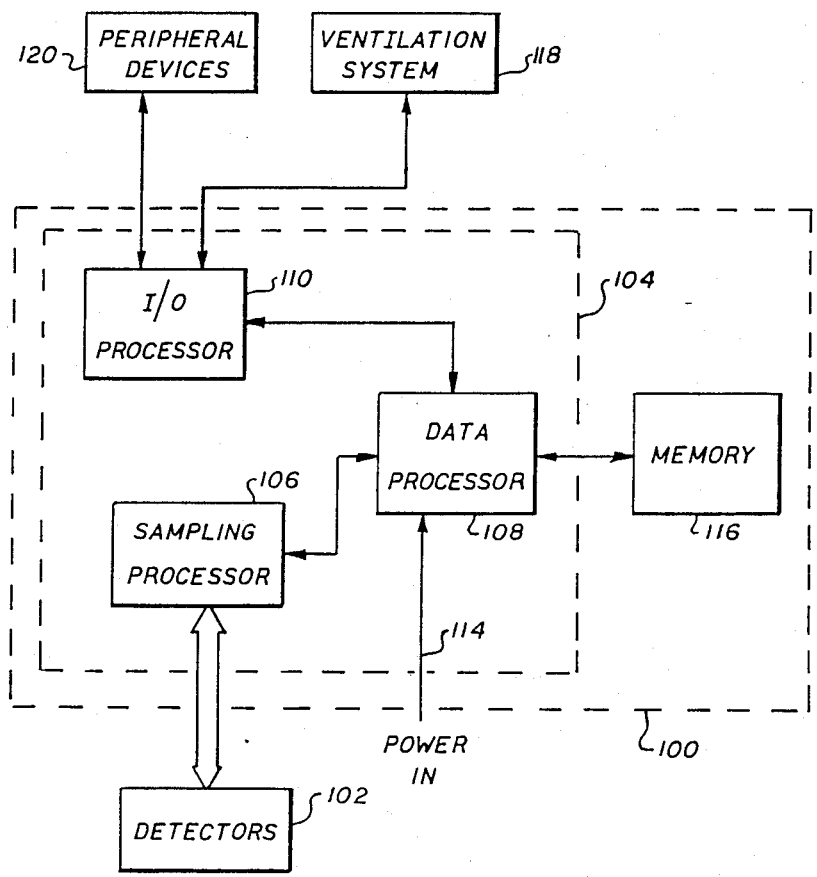
FIG. 9 is a block diagram further illustrating the system control of the monitoring system depicted in FIG. 8.
Figure 10:
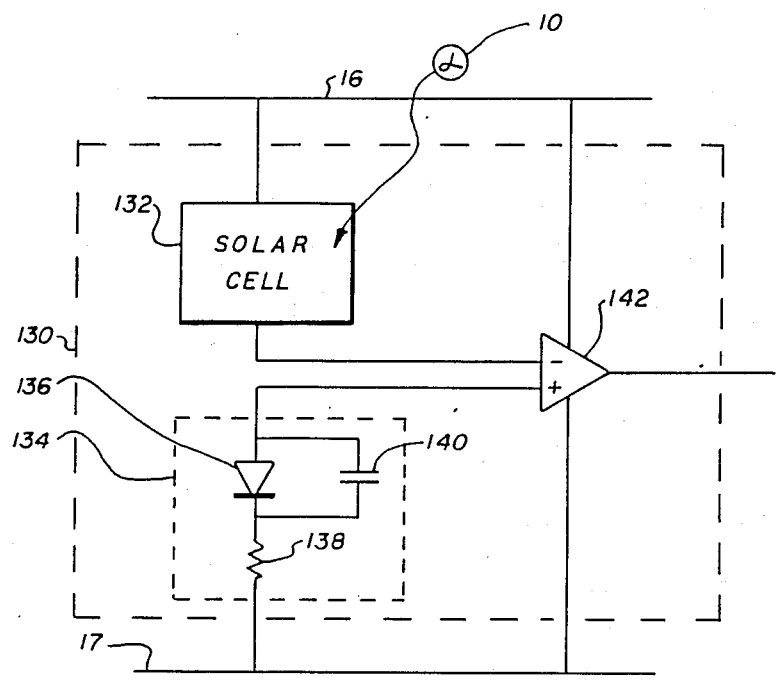

The system control 104 can be better understood by referring to FIG. 9, which further illustrates additional components of the system control 104 of FIG. 8. As stated above, data collected by detectors 102 is periodically sampled by sampling processor 106 then communicated to data processor 108, where the processed data is input to memory 116. If additional data is to be stored in memory 116, it is input from either ventilation system 117 or peripheral devices 120 to I/O (Input/Output) processor 110 and then communicated to memory 116 through data processor 108. In accordance with the timing characteristics of system control 104, data stored in memory 116 is periodically read from the memory 116 by data processor 108. Data processor 108 evaluates all of the data according to pre-programmed algorithms in order to determine the level of radon concentration in dosimetric terms. After calculating the level of radon concentration, data processor 108 communicates the calculated data to I/O processor 110 which outputs the data to ventilation system 117 or peripheral devices 120.

Under normal operating conditions, the calculated data would be automatically output from I/O processor 110 to peripheral devices 120, where the level of radon concentration can be reported in readily (human) understandable terms, or without further extrapolation. This process may be readily changed by entering configuration data changes, such as timing or control changes, through peripheral devices 120 or ventilation system 117 to data processor 108. Control changes would be modifications in the configuration data or in the algorithms used by data processor 108, or some similar change. Similarly, data processor 108 may be programmed to ignore some of the data stored and transferred from memory 116, such as may be necessary when one sensor or detector is determined not to be functioning correctly.

As described, the above system can be utilized as a radon detector in either liquid or gaseous environments, such as wells and water supplies, or buildings and mine shafts. If linked to the ventilation control system 117 of a building, or other type of control system, the results of the radon detector can be used to regulate the flow of fluid through an area in such a way as to reduce the level of radon concentration, or sound an alarm if dangerous levels have been achieved. Likewise, the above device can be made portable, so that a person, such as an uranium miner, can be provided with accurate, easily understandable detection results.

Although the present invention has been disclosed above in terms of a preferred embodiment, it is contemplated that numerous alterations and modifications of the invention will be apparent to those skilled in the art after having read the above disclosure. It is therefore intended that the following claims be interpreted as covering all such alterations and modifications as fall within the true spirit and scope of the invention.

What is claimed is:

1. A device for monitoring radon exposure, comprising:
    means forming a photon impenetrable detection chamber of a predetermined volume for continuously receiving a sampling flow of fluid from an environment being monitored;
    at least one alpha particle detector being an integrated circuit disposed within said chamber, said detector having a plurality of radiation sensitive capacitance means positioned to be exposed to alpha particles within said sampling flow, said alpha particle detector being responsive to said alpha particles contacting said capacitance means and operative to develop a detection signal; and a monitoring system for receiving a plurality of input signals including said detection signal, calculating the level of radon concentration within said environment, and generating an output signal commensurate therewith.

2. A device for monitoring radon exposure as recited in claim 1, wherein said detection chamber is shaped to restrict said sampling flow's path to within a detectable range of said alpha particle detector.

3. A device for monitoring radon exposure as recited in claim 2, wherein said detection chamber includes a temperature sensor for monitoring the temperature of said sampling flow and developing a temperature signal for input to said monitoring system.

4. A device for monitoring radon exposure as recited in claim 3, wherein said detection chamber includes a humidity sensor for monitoring the relative humidity of said sampling flow and developing a humidity signal for input to said monitoring system.

5. A device for monitoring radon exposure as recited in claim 1, wherein said detection chamber includes means for receiving and electrically interfacing said alpha particle detector with said monitoring system, and wherein said detection chamber is formed by a dome shaped cover wherein all interior surface points of said cover are located a predetermined distance d from at least one of said capacitance means, where d is a positive integer proportional to the visibility range of alpha particles within said environment.

6. A device for monitoring radon exposure as recited in claim 5, wherein said detection chamber includes a temperature sensor for monitoring the temperature of said sampling flow and developing a temperature signal for input to said monitoring system.

7. A device for monitoring radon exposure as recited in claim 6, wherein said detection chamber includes a humidity sensor for monitoring the relative humidity of said sampling flow and developing a humidity signal for input to said monitoring system.

8. A device for monitoring radon exposure as recited in claim 1, wherein means forming said chamber is a cube having at least one alpha particle detector disposed within each of five faces of said cube and means disposed in said five faces for receiving and electrically interfacing said alpha particle detectors with said monitoring system, and wherein all interior surface points of said cube are within a distance d of at least one of said capacitance means, where d is a positive integer proportional to the visibility of alpha particles within said environment.

9. A device for monitoring radon exposure as recited in claim 8, wherein said detection chamber includes a temperature sensor for monitoring the temperature of said sampling flow and developing a temperature signal for input to said monitoring system.

10. A device for monitoring radon exposure as recited in claim 9, wherein said detection chamber includes a humidity sensor for monitoring the relative humidity of said sampling flow and developing a humidity signal for input to said monitoring system.

11. A device for monitoring radon exposure as recited in claim 1, wherein said alpha particle detector is an integrated circuit having a plurality of radiation sensitive memory cells arranged in an orthogonal array of rows and columns.

12. A device for monitoring radon exposure as recited in claim 11, wherein said memory cells are charged in either a positive or negative direction in response to interaction with said alpha particles.

13. A device for monitoring radon exposure as recited in claim 12, wherein said orthogonal array encompasses an area of at least 1.0 sq. cm.

14. A device for monitoring radon exposure as recited in claim 12, wherein said memory cells operate at a voltage charge level and refresh rate approaching the thermal noise level of said memory cells.

15. A device for monitoring radon exposure as recited in claim 1, wherein said alpha particle detector is an integrated circuit having a plurality of radiation sensitive memory cells arranged in concentric circles.

16. A device for monitoring radon exposure as recited in claim 1, further comprising:

peripheral devices for entering configuration data and displaying a calculated level of radon concentration, and wherein said monitoring system includes memory means for receiving and storing data signals including said detection signal and outputting selected data upon command; and system control means for receiving detector data signals input from a plurality of said detectors, receiving said configuration data input from one or more of said peripheral devices, processing said detector data signals for input to said memory means within said data signals, processing said configuration data for input to said memory means within said data signals, receiving selected data output from said memory means upon command of said system control means, processing said selected data in a predetermined manner to generate a calculated level of radon concentration signal corresponding to the level of radon concentration within said environment, and outputting said calculated level of radon concentration signal to one or more of said peripheral devices.

17. A device for monitoring radon exposure as recited in claim 16, wherein said system control means includes:

sampling processor means for receiving said detector data signals input from said plurality of detectors and developing and outputting a processed detector data signal;

input/output processor means for receiving configuration data input from one or more of said peripheral devices, developing a configuration data signal, receiving said calculated level of radon concentration signal and outputting said calculated level of radon concentration signal to one or more of said peripheral devices; and data processing means for receiving said processed detector data signal and said configuration data signal, outputting said processed detector data signal and said configuration data signal to said memory means, commanding and receiving said selected data from said memory means, processing said selected data in a predetermined manner to generate said calculated level of radon concentration signal corresponding to the level of radon concentration within said environment, and outputting said calculated level of radon concentration signal to said input/output processor means for communication to one or more of said peripheral devices.

18. A device for monitoring radon exposure as recited in claim 16, wherein said peripheral devices include a ventilation system which develops and outputs said configuration data signals to said system control means, receives said calculated level of radon concentration signal input from said system control means, and modifies the flow of fluid within said sampled environment in order to compensate for the level of radon concentration within said

* * * * *